United States Patent
Jung et al.

(10) Patent No.: US 10,432,170 B2
(45) Date of Patent: Oct. 1, 2019

(54) ACOUSTIC WAVE FILTER DEVICE

(71) Applicant: SAMSUNG ELECTRO-MECHANICS CO., LTD, Suwon-si (KR)

(72) Inventors: Jae Hyun Jung, Suwon-si (KR); Seung Wook Park, Suwon-si (KR); Seong Hun Na, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 166 days.

(21) Appl. No.: 15/675,137

(22) Filed: Aug. 11, 2017

(65) Prior Publication Data

US 2018/0159505 A1    Jun. 7, 2018

(30) Foreign Application Priority Data

Dec. 5, 2016  (KR) .................... 10-2016-0164479

(51) Int. Cl.
| | |
|---|---|
| *H03H 9/10* | (2006.01) |
| *H03H 9/17* | (2006.01) |
| *H01L 41/047* | (2006.01) |
| *H03H 9/25* | (2006.01) |
| *H03H 9/64* | (2006.01) |
| *H03H 9/05* | (2006.01) |

(Continued)

(52) U.S. Cl.
CPC ......... *H03H 9/1092* (2013.01); *H01L 41/047* (2013.01); *H01L 41/053* (2013.01); *H03H 9/02228* (2013.01); *H03H 9/059* (2013.01); *H03H 9/0576* (2013.01); *H03H 9/1071* (2013.01); *H03H 9/172* (2013.01); *H03H 9/25* (2013.01); *H03H 9/6426* (2013.01)

(58) Field of Classification Search
CPC ...... H03H 9/059; H03H 9/0576; H03H 9/058; H03H 9/02228; H03H 9/1071; H03H 9/1092; H03H 9/172; H03H 9/25; H03H 9/64; H03H 9/6426; H01L 41/053; H01L 41/047
USPC ................... 333/193–196; 310/313 R, 313 B
See application file for complete search history.

(56) References Cited

U.S. PATENT DOCUMENTS 6,417,026 B2 * 7/2002 Gotoh ................ H01L 23/3135
                                                      257/E23.126
2013/0335171 A1   12/2013 Yamato et al.
(Continued)

FOREIGN PATENT DOCUMENTS

| JP | 2008-005241 A | * | 1/2008 |
|---|---|---|---|
| JP | 2011-23929 A | | 2/2011 |

(Continued)

OTHER PUBLICATIONS

English language machine translation of JP 2015-142228 A, published Aug. 3, 2015, 9 pages. (Year: 2015).*

(Continued)

*Primary Examiner* — Barbara Summons
(74) *Attorney, Agent, or Firm* — NSIP Law

(57) ABSTRACT

An acoustic wave filter device includes a filter disposed on a substrate, a wall member disposed on the substrate and surrounding the filter, a cap member disposed on the wall member and bounding an internal space with the wall member; and a support member disposed on the cap member. The support member is disposed above the internal space and includes a bump disposed on the cap member.

18 Claims, 4 Drawing Sheets

(51) Int. Cl.
*H03H 9/02* (2006.01)
*H01L 41/053* (2006.01)

(56) References Cited

U.S. PATENT DOCUMENTS

| | | | | |
|---|---|---|---|---|
| 2014/0111062 A1* | 4/2014 | Bauer | ............. | B81C 1/00301 |
| | | | | 310/313 R |
| 2014/0132368 A1* | 5/2014 | Tsuda | ............. | H03H 3/08 |
| | | | | 333/193 |
| 2015/0185611 A1* | 7/2015 | Katou | ............. | C08F 2/48 |
| | | | | 430/18 |
| 2015/0194948 A1 | 7/2015 | Inate | | |
| 2018/0026603 A1* | 1/2018 | Iwamoto | ............. | H01L 23/02 |
| | | | | 310/311 |

FOREIGN PATENT DOCUMENTS

| | | |
|---|---|---|
| JP | 5514898 B2 | 6/2014 |
| JP | 5591163 B2 | 9/2014 |
| JP | 5660197 B2 | 1/2015 |
| JP | 2015-142228 A * | 8/2015 |
| KR | 10-1645172 B1 | 8/2016 |

OTHER PUBLICATIONS

English language machine translation of JP 2008-005241 A, published Jan. 10, 2008, 12 pages. (Year: 2008).*

* cited by examiner

ACOUSTIC WAVE FILTER DEVICE

CROSS-REFERENCE TO RELATED APPLICATIONS

This application claims the benefit under 35 USC 119(a) of Korean Patent Application No. 10-2016-0164479 filed on Dec. 5, 2016, in the Korean Intellectual Property Office, the entire disclosure of which is incorporated herein by reference for all purposes.

BACKGROUND

1. Field

The following description relates to an acoustic wave filter device.

2. Description of Related Art

Currently, most wafer-level packages (WLP) having a cavity include a micro-electro-mechanical-system (MEMS) and a filter package.

As filter packages included in wafer-level packages have become smaller and thinner, manufacturing techniques such as chip-scale packaging (CSP), wafer-to-wafer level packaging, and film packaging, among others, have been developed. Acoustic wave filter devices have been manufactured using these manufacturing techniques.

During a manufacturing process of an acoustic wave filter device, and specifically during the molding process, when internal pressure increases in order to realize a proper internal pressure for molding, and/or when a polymer having a low strain rate is used as a cap member, it may be necessary to have a thicker cap member to avoid deformation or other problems. Inclusion of a thicker cap member is problematic in the production of thin acoustic wave filter packages as it increases the thickness of the overall package.

Thus, it may be advantageous to develop a structure capable of reducing a thickness of a cap member while ensuring proper internal pressure during a molding process. In other words, it may be advantageous to develop a structure capable of suppressing deformation of a cap member during a molding process.

SUMMARY

This Summary is provided to introduce a selection of concepts that are further described below in the Detailed Description in simplified form. This Summary is not intended to identify key features or essential features of the claimed subject matter, nor is it intended to be used as an aid in determining the scope of the claimed subject matter.

According to an exemplary embodiment, an acoustic wave filter device includes a filter disposed on a substrate, a wall member disposed on the substrate and surrounding the filter, a cap member disposed on the wall member and bounding an internal space with the wall member; and a support member disposed on the cap member. The support member is disposed above the internal space and includes at least one bump disposed on the cap member.

The cap member may include a metal or an alloy, and the support member may be formed on an upper surface of the cap member.

The support member may be exposed through a passivation layer disposed on the cap member.

The acoustic wave filter device may also include an under-bump metal member disposed adjacent to the wall member and a solder ball formed on the under-bump metal member.

The solder ball may protrude to a height of or above the support member.

A metal layer may be disposed on the substrate and may be electrically connected to the under-bump metal member.

The cap member may include one of a polymer and a material containing a polymer.

A pad made of a metal may be disposed on the cap member, and the pad may be disposed under the support member.

The support member may include a plurality of support members disposed on an upper surface of the cap member.

The support members of the plurality of support members may be disposed in at least one row and at least one column.

The solder ball may include a plurality of solder balls, the under-bump metal member may include a plurality of under-bump metal members and each solder ball of the plurality of solder balls may be disposed on a corresponding under-bump metal member of the plurality of under-bump metal members.

According to an exemplary embodiment, an acoustic wave filter device includes a filter disposed on a substrate, a wall member disposed on the substrate and surrounding the filter, an under-bump metal member disposed adjacent to the wall member, a solder ball disposed on the under-bump metal member, a cap member formed above the wall member and bounding an internal space with the wall member, and a support member disposed on the cap member. The support member is disposed above the internal space and includes at least one bump disposed on the cap member and the solder ball protrudes to a height of or above the support member.

The cap member may include a metal or alloy, and the support member may be disposed on an upper surface of the cap member.

The support member may be exposed through a passivation layer disposed on the cap member.

The cap member may include one of a polymer and a material containing a polymer.

A pad made of a metal may be disposed on the cap member, and the pad may be disposed under the support member.

A metal layer may be disposed on the substrate and may be electrically connected to the under-bump metal member.

The support member may include a plurality of support members disposed on an upper surface of the cap member.

Exemplary embodiments provide an acoustic wave filter device capable of reducing narrowing of an internal space in which a filter is disposed when a molding layer is formed.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
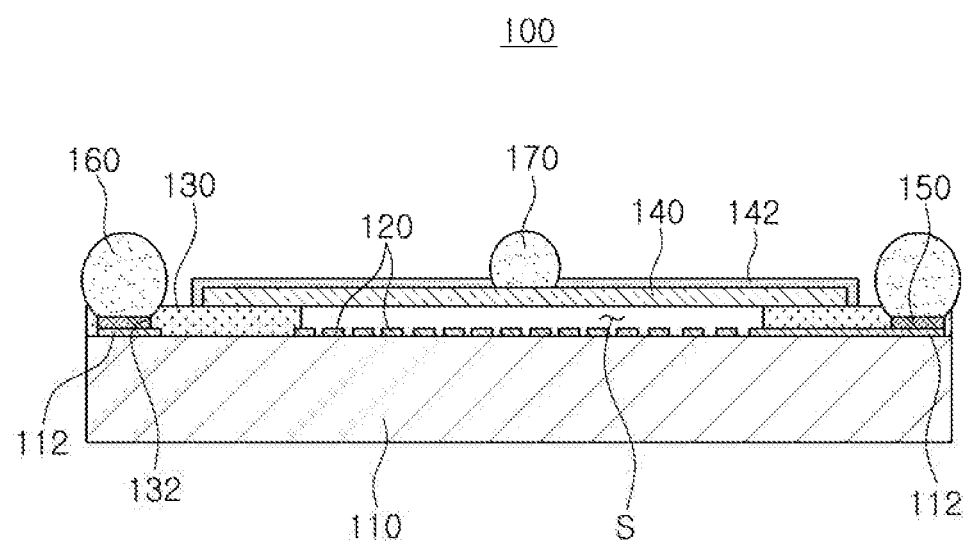
FIG. 1 is a schematic cross-sectional view illustrating an acoustic wave filter device according to an exemplary embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Subsequently, examples are described in further detail with reference to the accompanying drawings.

Unless indicated otherwise, a statement that a first layer is "on" or "connected to" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Figure 2:
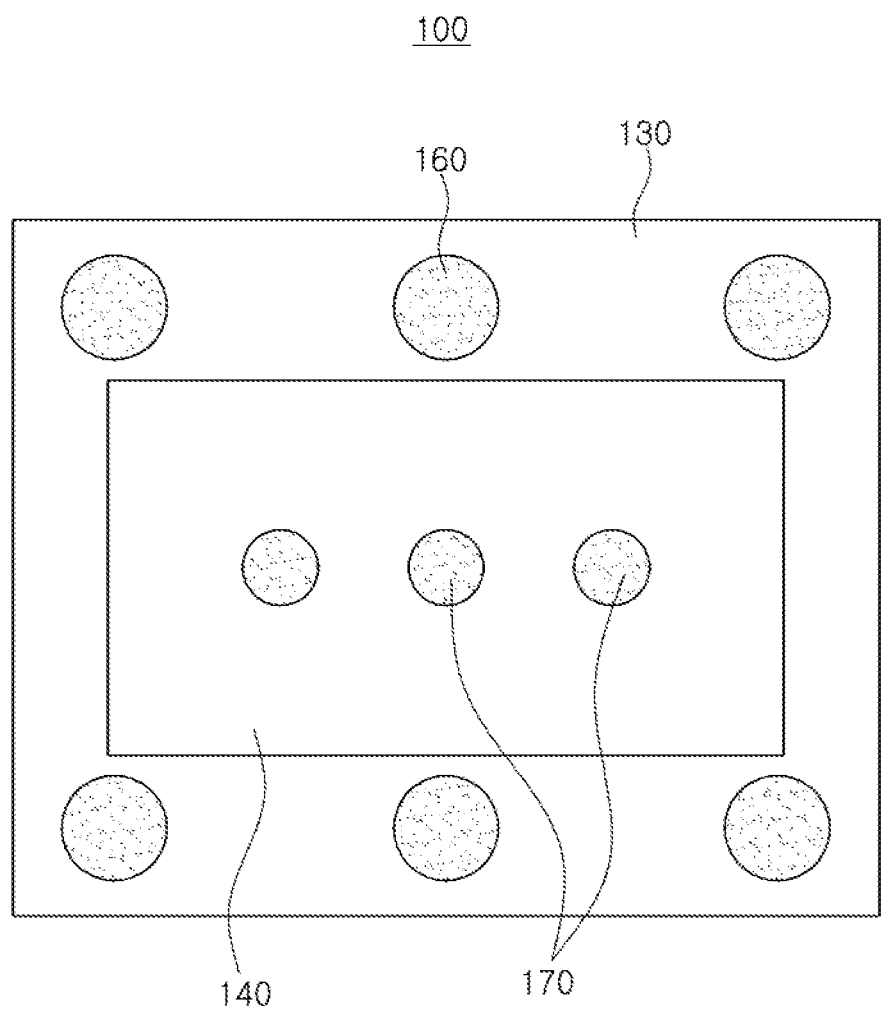
FIG. 2 is a plan view illustrating an acoustic wave filter device according to an exemplary embodiment.

FIG. 1 is a schematic cross-sectional view illustrating an acoustic wave filter device according to an exemplary embodiment. FIG. 2 is a plan view illustrating an acoustic wave filter device according to an exemplary embodiment.

Referring to FIGS. 1 and 2, an acoustic wave filter device 100, may include, for example, a substrate 110, a filter unit 120, a wall member 130, a cap member 140, an under-bump metal member 150, a solder ball 160, and a support member 170.

The substrate 110 may be a piezoelectric substrate. For example, the substrate 110 may be a substrate in which a piezoelectric single crystal such as $LiTaO_3$, $LiNbO_3$, etc., a piezoelectric ceramic, and/or a piezoelectric thin film, is formed on a main surface of the substrate 110. However, these are merely exemplary, and piezoelectric single crystals may be formed of other material or combinations of materials.

A metal layer 112 may be formed on the substrate 110 to surround the filter unit 120 in a top-down view. The metal layer 112 may be formed of the same material as the filter unit 120. For example, the metal layer 112 may be formed of one or more of titanium (Ti), nickel (Ni), aluminum (Al), copper (Cu), and AlCu.

As described above, the metal layer 112 and the filter unit 120 may be formed of the same material, so formation of the metal layer 112 may be more easily performed. Thus, the process of forming the metal layer 112 and the filter unit 120 may have increased efficiency.

The metal layer 112 and the filter unit 120 may be formed by a chemical vapor deposition (CVD) or a physical vapor deposition (PVD), but the formation process is not limited thereto. For example, the metal layer 112 and the filter unit 120 may be formed by a plating method, a metalorganic chemical vapor deposition (MOCVD) process, or the like.

As shown in FIG. 1, the filter unit 120 may be formed in a central portion of the substrate 110. For example, the filter unit 120 may be formed in a single interdigital (IDT) pattern, however, embodiments are not limited thereto. For example, various IDT patterns may be formed together on the portion of the substrate 110 to form the filter unit 120. The metal layer 112 and the wall member 130 may be formed to surround the filter unit 120 in a top-down view.

The filter unit 120 may be formed of the same material as the metal layer 112, as described above.

The wall member 130 may be formed to surround the filter unit 120 in a top-down view, and may form an internal space S bounded by the cap member 140. The wall member 130 may be formed of, for example, a photoimageable film, but is not limited thereto. As only an example, the wall member 130 may be formed of one of a liquid resin and a film resin.

An insertion hole 132 may be formed in the wall member 130. Under-bump metal member 150 and a portion of the solder ball 160 may be inserted and, therefore, disposed in the insertion hole 132.

The cap member 140 may be formed in a layer above the wall member 130, and may form the internal space S with the wall member 130. The cap member 140 may be formed of, for example, a metal material or a combination of metal materials (i.e. an alloy). Cap member 140 may be formed of a single material formed in a single layer, such as is shown in FIG. 1, but is not limited thereto. The cap member 140 may be formed by bonding an additional plate, formed of a same or different material, thereto.

As shown in FIG. 1, a passivation layer 142 exposing the support member 170 may be formed on the cap member 140. The passivation layer 142 may prevent the cap member 140 from being insulated and may prevent the cap member 140 from being damaged.

As shown in FIG. 1, passivation layer 142 may be formed on an upper surface and a side surface of the cap member 140, but embodiments are not limited thereto. For example, the passivation layer 142 may additionally or alternatively be formed on a bottom surface of the cap member 140.

The under-bump metal member 150 may be formed on the metal layer 112 disposed on the substrate 110. A metal film (not shown) may be formed on the under-bump metal member 150 to connect the under-bump metal member to the solder ball 160. That is, the metal layer 112 may be electrically connected to the under-bump metal member 150. The metal film may be formed of a appropriate metal dependent on a metal forming the under-bump metal member 150. However, as described above, the metal film may not be included.

As shown in FIG. 1, the under-bump metal member 150 is disposed in the insertion hole 132 in the wall member 130, but is not limited thereto.

The under-bump metal member 150 may be disposed outside the wall member 130 in a top-down view. That is, the wall member 130 may be formed to be disposed inwardly of the under-bump metal member 150 in the top-down view.

The under-bump metal member 150 may have a substantially cylindrical shape to facilitate the bonding of the solder ball 160.

The solder ball 160 may be formed on the under-bump metal member 150, and may protrude from the insertion hole 132 in the wall member 130. Although a single solder ball is shown, embodiments are not limited thereto. For example, the solder ball 160 may be provided as a plurality of solder balls, as part of a configuration of being bonded to a connection pad of a main substrate when at least one of the plurality of solder balls is disposed on the main substrate (not shown). Each solder ball of the plurality of solder balls may be formed on a corresponding under-bump metal member 150.

The support member 170 may be formed on the cap member 140. The support member 170 may be formed of at least one bump formed on the cap member 140 to be disposed above the internal space S.

The support member 170 may be provided as a plurality of support members arranged and dispersed on the cap member 140. The support member 170 may have a height so as to not protrude higher than the solder ball 160.

After the acoustic wave filter device 100 is mounted on a main substrate (not shown), a space between the cap member 140 and the main substrate may be filled using a resin mold. In this case, the support member 170 becomes connected to the main substrate. When filing the resin mold, pressure is applied to the cap member 140, and the cap member 140 is therefore prevented from being deformed.

Thus, the internal space S bounded by the cap member 140 and the wall member 130 is prevented from being reduced during the manufacturing process. As a result, reliability of the acoustic wave filter device 100 may be improved. In the drawings, the case in which the support member 170 is provided as three support members formed a row (for example, in FIG. 2) is illustrated by way of example, but is not limited thereto.

As described above, the support member 170 is formed on the cap member 140. Thus, when filling a resin mold as described above, if pressure (for example, a pressure of about 75 bars) is applied to the cap member 140, the cap member 140 may be prevented from being deformed. In other words, when the support member 170 is connected to the main substrate, the cap member 140 is supported by the support member 170, so the cap member 140 may be prevented from being deformed.

As a result, the internal space S bounded by the cap member 140 and the wall member 130 may be prevented from being reduced, so reliability of the acoustic wave filter device 100 may be improved.

Hereinafter, modified examples of a support member will be described with reference to the accompanying drawings.

Figure 3:
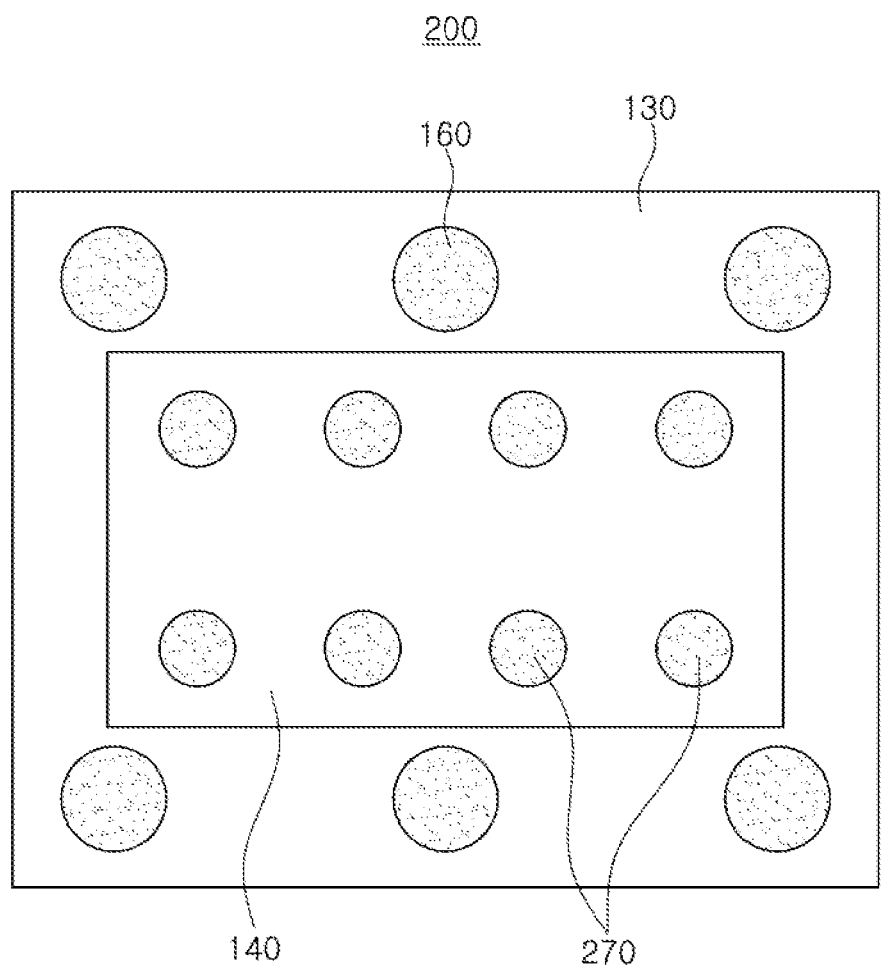
FIG. 3 is a plan view illustrating a modified example of a support member included in an acoustic wave filter device.

FIG. 3 is a plan view illustrating an exemplary embodiment of a support member included in an acoustic wave filter device.

Referring to FIG. 3, support members 270 are included in an acoustic wave filter device 200. A support member 270 is formed on the cap member 140. The support member 270 is formed as at least one bump formed on the cap member 140, the cap member 140 being disposed above an internal space S (see, for example, FIG. 1).

As shown in FIG. 3, the support member 270 is provided as a plurality of support members dispersed and disposed on the cap member 140. The support member 270 may have a height so as to not protrude above the solder ball 160.

The support member 270 may be disposed to form a plurality of rows and columns of support members, but is not limited thereto, as other arrangements may also be used.

After the acoustic wave filter device 200 is mounted on a main substrate (not shown), a space between the cap member 140 and the main substrate may be filled using a resin mold. In this case, as the support member 270 becomes connected to the main substrate. When filling the resin mold, pressure is applied to the cap member 140, and the cap member 140 is therefore prevented from being deformed.

As a result, the internal space S bounded by the cap member 140 and the wall member 130 may be prevented from being reduced, so reliability of the acoustic wave filter device 200 may be improved.

Figure 4:
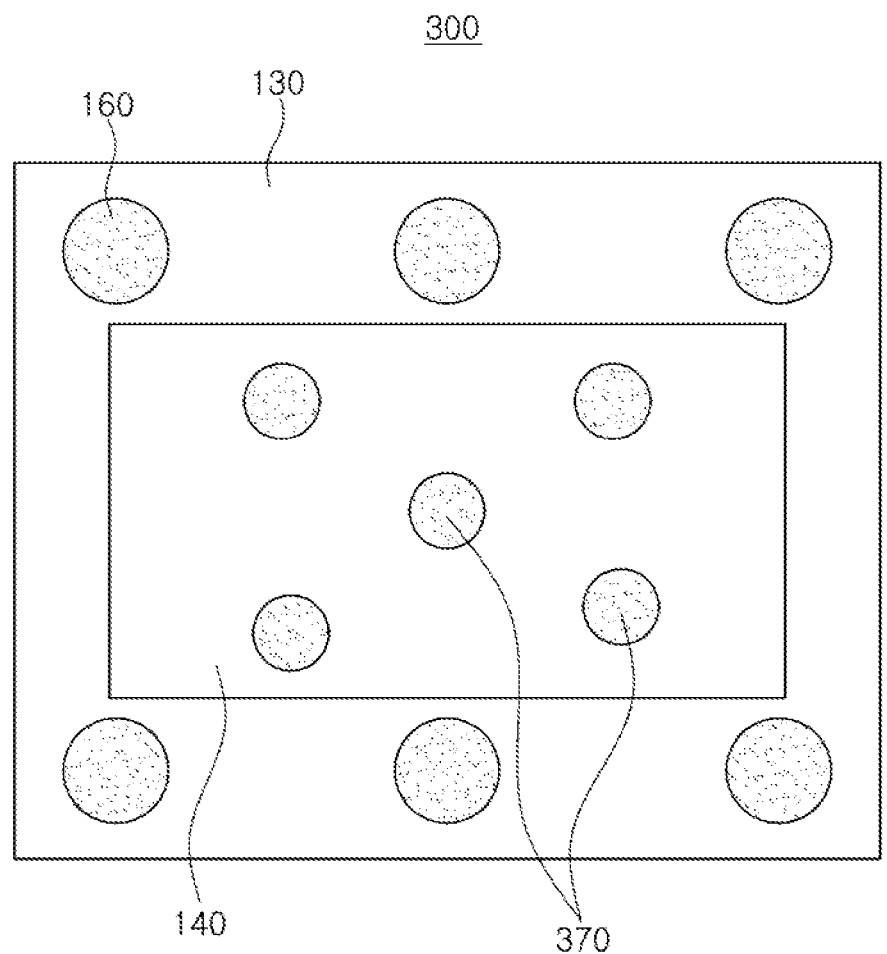
FIG. 4 is a plan view illustrating a modified example of a support member included in an acoustic wave filter device.

FIG. 4 is a plan view illustrating an exemplary embodiment of a support member included in an acoustic wave filter device.

Referring to FIG. 4, support members 370 are included in an acoustic wave filter device 300. A support member 370 is formed on the cap member 140. The support member 370 is formed as at least one bump formed on the cap member 140, the cap member 140 being disposed above an internal space S (see, for example, FIG. 1).

As shown in FIG. 4, the support member 370 is provided as a plurality of support members dispersed and disposed on the cap member 140. The support member 370 may have a high such that it does not protrude above the solder ball 160.

As shown in FIG. 4, a case in which five support members 370 are disposed to be dispersed on the cap member 140 is illustrated by way of example, but is not limited thereto. In other words, the number and arrangement of the support member 370 may be variously changed.

Hereinafter, an acoustic wave filter device according to an exemplary embodiment will be described with reference to the accompanying drawings. The same reference numerals as those of the components disclosed above are used herein, and thus, a detailed description thereof will be omitted.

Figure 5:
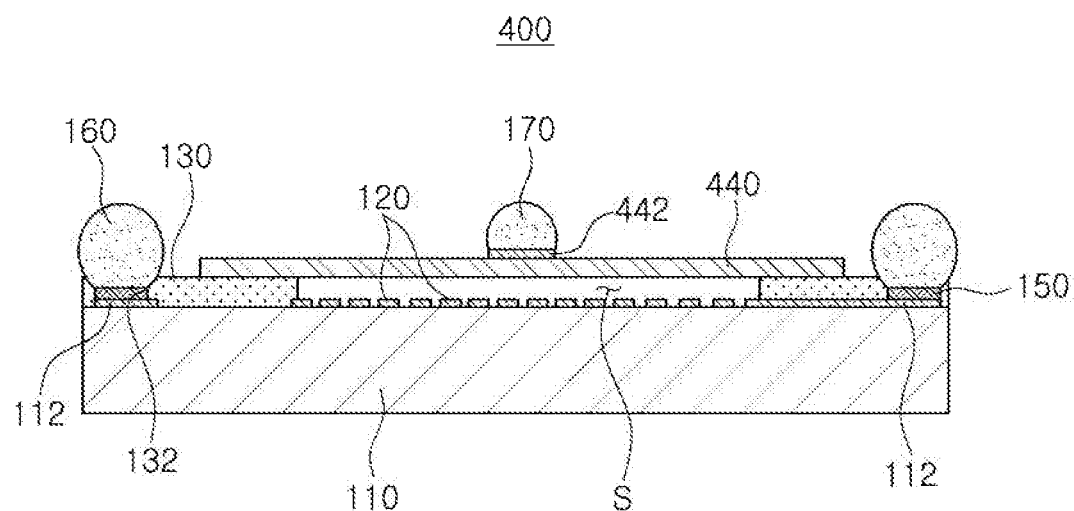
FIG. 5 is a schematic cross-sectional view illustrating an acoustic wave filter device according to an exemplary embodiment.

FIG. 5 is a schematic cross-sectional view illustrating an acoustic wave filter device according to an exemplary embodiment.

Referring to FIG. 5, an acoustic wave filter device may include a substrate 110, a filter unit 120, a wall member 130, a cap member 440, an under-bump metal member 150, a solder ball 160, and a support member 170.

In FIG. 5, The substrate 110, the filter unit 120, the wall member 130, the under-bump metal member 150, the solder ball 160, and the support member 170 correspond to the same configurations as the configurations described above with reference to, for example, FIGS. 1-4, so that detailed descriptions thereof will be omitted hereinafter.

The cap member 440 is formed at least partially on the wall member 130 and may bound an internal space S with the wall member 130. The cap member 440 may be formed of, as only an example, a polymer material. That is, the cap member 440 may be formed of an insulating material.

A pad 442 formed of a metal for connection of the support member 170 and the cap member 440 may be formed on the cap member 440.

As described above, the support member 170 is formed on the cap member 440. Thus, when filing a resin mold as described above, if pressure (for example, a pressure of about 75 bars) is applied to the cap member 440, the cap member 440 may be prevented from being deformed. In other words, when the support member 170 is connected to a main substrate, the cap member 440 is supported by the support member 170, so the cap member 440 may be prevented from being deformed.

As a result, the internal space S bounded by the cap member 440 and the wall member 130 may be prevented from being reduced, so reliability of the acoustic wave filter device 400 may be improved.

According to the above exemplary embodiments, a case in which acoustic wave filter devices 100 and 400 are applied as a surface acoustic wave filter device is illustrated by way of example, but is not limited thereto. For example, the acoustic wave filter device 100 may be applied to a bulk acoustic wave filter device.

As set forth above, according to the exemplary embodiments, reduction of an internal space in which a filter unit is disposed due to deformation of a cap member may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter device, comprising:
a filter disposed on a substrate;
a wall member disposed on the substrate and surrounding the filter;
a cap member disposed on the wall member and bounding an internal space with the wall member; and
a support member disposed on the cap member,
wherein the support member is disposed above the internal space and comprises a bump disposed on the cap member, and
wherein the support member is exposed through a passivation layer disposed on the cap member.

2. The acoustic wave filter device of claim 1, wherein the cap member comprises a metal or an alloy, and the support member is formed on an upper surface of the cap member.

3. The acoustic wave filter device of claim 1, further comprising:
an under-bump metal member disposed adjacent to the wall member; and
a solder ball formed on the under-bump metal member.

4. The acoustic wave filter device of claim 3, wherein the solder ball protrudes to a height of or above the support member.

5. The acoustic wave filter device of claim 4, wherein the solder ball protrudes from an insertion hole in the wall member.

6. The acoustic wave filter device of claim 3, wherein a metal layer is disposed on the substrate and is electrically connected to the under-bump metal member.

7. The acoustic wave filter device of claim 3, wherein:
the solder ball comprises a plurality of solder balls;
the under-bump metal member comprises a plurality of under-bump metal members; and
each solder ball of the plurality of solder balls is disposed on a corresponding under-bump metal member of the plurality of under-bump metal members.

8. The acoustic wave filter device of claim 1, wherein the cap member comprises one of a polymer and a material containing a polymer.

9. The acoustic wave filter device of claim 1, wherein a pad comprised of a metal is disposed on the cap member, and the pad is disposed under the support member.

10. The acoustic wave filter device of claim 1, wherein the support member comprises a plurality of support members disposed on an upper surface of the cap member.

11. The acoustic wave filter device of claim 10, wherein the support members of the plurality of support members are disposed in at least one row and at least one column.

12. An acoustic wave filter device, comprising:
a filter unit disposed on a substrate;
a wall member disposed on the substrate and surrounding the filter;
an under-bump metal member disposed adjacent to the wall member;
a solder ball disposed on the under-bump metal member;
a cap member formed above the wall member and bounding an internal space with the wall member; and
a support member disposed on the cap member,
wherein the support member is disposed above the internal space and comprises a bump disposed on the cap member, and
the solder ball protrudes to a height of or above the support member,
wherein the support member is exposed through a passivation layer disposed on the cap member.

13. The acoustic wave filter device of claim 12, wherein the cap member comprises a metal or an alloy, and the support member is disposed on an upper surface of the cap member.

14. The acoustic wave filter device of claim 12, wherein the cap member comprises one of a polymer and a material containing a polymer.

15. The acoustic wave filter device of claim 14, wherein a pad comprised of a metal is disposed on the cap member, and the pad is disposed under the support member.

16. The acoustic wave filter device of claim 12, wherein a metal layer is disposed on the substrate and is electrically connected to the under-bump metal member.

17. The acoustic wave filter device of claim 12, wherein the support member comprises a plurality of support members disposed on an upper surface of the cap member.

18. An acoustic wave filter device, comprising:
a filter unit disposed on a substrate;
a wall member disposed on the substrate and surrounding the filter;
an under-bump metal member disposed adjacent to the wall member;
a solder ball disposed on the under-bump metal member;
a cap member formed above the wall member and bounding an internal space with the wall member; and a support member disposed on the cap member,
wherein the support member is disposed above the internal space and comprises a bump disposed on the cap member, and
the solder ball protrudes to a height of or above the support member,
wherein a pad comprised of a metal is disposed on the cap member, and the pad is disposed under the support member.

\* \* \* \* \*